United States Patent
Pylant et al.

(10) Patent No.: US 8,104,619 B2
(45) Date of Patent: *Jan. 31, 2012

(54) WAFER CONTAINER WITH STAGGERED WALL STRUCTURE

(75) Inventors: James D. Pylant, Temecula, CA (US); Galen J. Hoffman, Corona, CA (US); Alan Waber, Wildomar, CA (US); Amos E. Avery, Rochester, MN (US)

(73) Assignee: Daewon Semiconductor Packaging Industrial Co., Ltd., Hanam-Si, Gyunggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/904,405

(22) Filed: Oct. 14, 2010

(65) Prior Publication Data

US 2011/0036748 A1 Feb. 17, 2011

Related U.S. Application Data

(63) Continuation of application No. 12/012,371, filed on Feb. 1, 2008, now Pat. No. 7,918,341.

(60) Provisional application No. 60/998,678, filed on Oct. 12, 2007.

(51) Int. Cl.
*B65D 85/48* (2006.01)
(52) U.S. Cl. .................................. 206/710; 206/454
(58) Field of Classification Search .................. 206/303, 206/308.1, 454, 710, 711; 211/41.18; 118/500
See application file for complete search history.

(56) References Cited

U.S. PATENT DOCUMENTS

| | | | |
|---|---|---|---|
| 4,333,580 A | 6/1982 | Sweigart | |
| 6,193,068 B1 * | 2/2001 | Lewis et al. | 206/710 |
| 6,341,695 B1 | 1/2002 | Lewis et al. | |
| 6,398,022 B1 | 6/2002 | Mou | |
| 6,533,123 B1 | 3/2003 | Nakamura et al. | |
| 6,550,619 B2 | 4/2003 | Bores et al. | |
| 6,564,946 B2 | 5/2003 | Lewis et al. | |
| 6,626,289 B2 | 9/2003 | Nagata | |
| 6,662,950 B1 | 12/2003 | Cleaver | |
| 6,988,620 B2 * | 1/2006 | Haggard et al. | 206/710 |
| 6,988,621 B2 | 1/2006 | Forsyth | |
| 7,040,487 B2 | 5/2006 | Zabka et al. | |
| 7,059,475 B2 | 6/2006 | Zabka | |
| 7,131,248 B2 | 11/2006 | Pylant et al. | |

(Continued)

FOREIGN PATENT DOCUMENTS

KR 2005-113889 5/2005

(Continued)

OTHER PUBLICATIONS

PCT International Search Report for PCT/US07/25434.

(Continued)

*Primary Examiner* — Luan K Bui
(74) *Attorney, Agent, or Firm* — Van Pelt, Yi & James LLP

(57) ABSTRACT

A wafer container comprising a base and a cover that nest together. The base includes a staggered wall structure composed of inner and outer walls. The staggered wall structure is arranged so that forces from side impacts are absorbed principally by outer wall segments. A rib on the cover restrains the outer wall segments from flexing beyond the inner wall diameter. Reference tabs on the base facilitate alignment of the base to the cover.

13 Claims, 11 Drawing Sheets

U.S. PATENT DOCUMENTS

| | | |
|---|---|---|
| 7,431,162 B2 | 10/2008 | Forsyth |
| 2003/0000856 A1 | 1/2003 | Lax et al. |
| 2004/0256285 A1* | 12/2004 | Forsyth ........................ 206/710 |
| 2005/0269241 A1 | 12/2005 | Brooks |
| 2010/0236976 A1 | 9/2010 | Pylant et al. |

FOREIGN PATENT DOCUMENTS

| | | |
|---|---|---|
| KR | 0414886 | 4/2006 |
| WO | WO9700820 | 1/1997 |
| WO | WO 9958412 | 11/1999 |
| WO | WO 2004087535 | 10/2004 |
| WO | WO2005019065 | 3/2005 |
| WO | W02005044695 | 5/2005 |
| WO | WO2005044695 | 5/2005 |
| WO | WO 2006125859 | 11/2006 |

OTHER PUBLICATIONS

International Preliminary Report on Patentability Chapter I for PCT/US07/25434.

* cited by examiner

WAFER CONTAINER WITH STAGGERED WALL STRUCTURE

RELATED APPLICATIONS

The present application is a continuation of U.S. application Ser. No. 12/012,371 entitled, "Wafer Container with Staggered Wall Structure", filed on Feb. 1, 2008, now U.S. Pat. No. 7,918,341, which claims benefit of Provisional Application No. 60/998,678, filed on Oct. 12, 2007.

BACKGROUND OF THE INVENTION

Semiconductor wafers are fragile substrates that can easily become scratched or damaged if not properly protected during transport. Each semiconductor wafer is patterned with numerous integrated circuits on a silicon substrate. Numerous containers have been developed to protect semiconductor wafers from damage during shipping and handling.

Frequently, the top and bottom half of wafer containers are improperly combined by an operator or become misaligned by forces that impact the containers during shipping. Such misalignment may contaminate, crack, or otherwise damage the valuable wafers stored within the containers.

Among the variety of horizontal wafer containers for semiconductor wafers, are containers having a dual wall structure. U.S. Pat. No. 6,193,068 (Lewis) is one example. The double walls in Lewis were designed to protect wafers from forces that may contact the outer wall of the base. However, in Lewis the outer wall is directly behind the inner wall and is aligned in a similar angular sector. Inner walls in such wafer containers are generally rigid and inadequately shock absorbent. An external force may be substantial enough to flex the outer wall into the inner wall, which in turn would damage the wafers stored within the wafer container.

There remains a need for a wafer container that is less prone to becoming separated and that is sufficiently robust to protect semiconductor wafers from forces transmitted during shipping and handling.

SUMMARY OF THE INVENTION

The present invention concerns a wafer container having a dual wall structure on the base. The wall structure comprises multiple outer walls and multiple inner walls. Each inner wall shares a minimal percentage of a common angular sector with each adjacent outer wall.

The present invention also concerns an alignment system for facilitating the proper alignment of a cover with a base. The alignment system includes reference tabs that are received by the cover and a visual identifier for guiding an operator in the proper alignment of the two halves of the container.

Another embodiment of the invention concerns a locking mechanism for securing two halves of a wafer container together. The bottom half comprises a wall structure perpendicular to the base. The wall structure comprises segmented inner and outer walls, each portion of the wall structure has a distinctive arc length. The arc length of each inner wall does not completely overlap with the arc length of any outer wall.

Yet another embodiment of the invention concerns a cover for a wafer container that engages to a base. The cover includes one or more notches, each having a ramp that easily receive latches from the base.

DETAILED DESCRIPTION OF THE INVENTION

Figure 1:
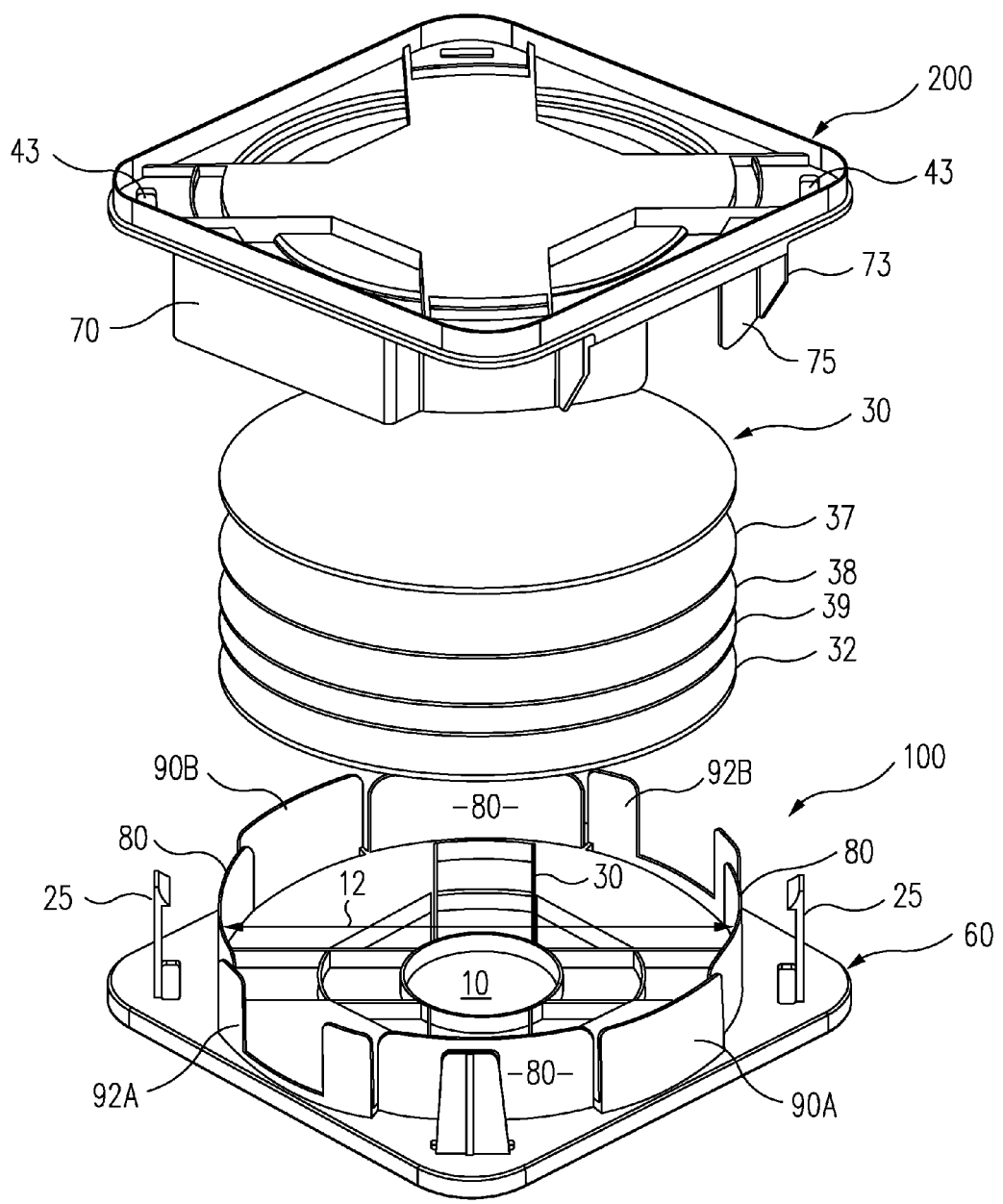
FIG. 1 is a perspective view of the container of the present invention showing wafers interposed between both halves of the container.

The container of the present invention stores semiconductor wafers, or semiconductor film frames. FIG. 1 illustrates the two halves of the container, a base 100 and its corresponding cover 200. A ribbed pattern on the floor 10 of deck 60 serves to reinforce the integrity of base 100. The storage area of base 100 is defined by inner walls 80, floor 10, and outer walls 90A, 90B, 92A, and 92B. Interposed between cover 200 and base 100 are wafers 30, 32 and wafer separators 37-39.

Upon impact, outer wall segments 90A, 90B, 92A, and 92B will flex to the inner diameter 12 of inner wall segments 80. Outer wall segments 90A, 90B, 92A, and 92B absorb the bulk of energy from side impact, thereby transferring a reduced amount of energy to the inner wall segments 80. Consequently, wafers 30 and 32 are sheltered from the brunt of forceful impact by the staggered wall structure of the invention.

Figure 2:
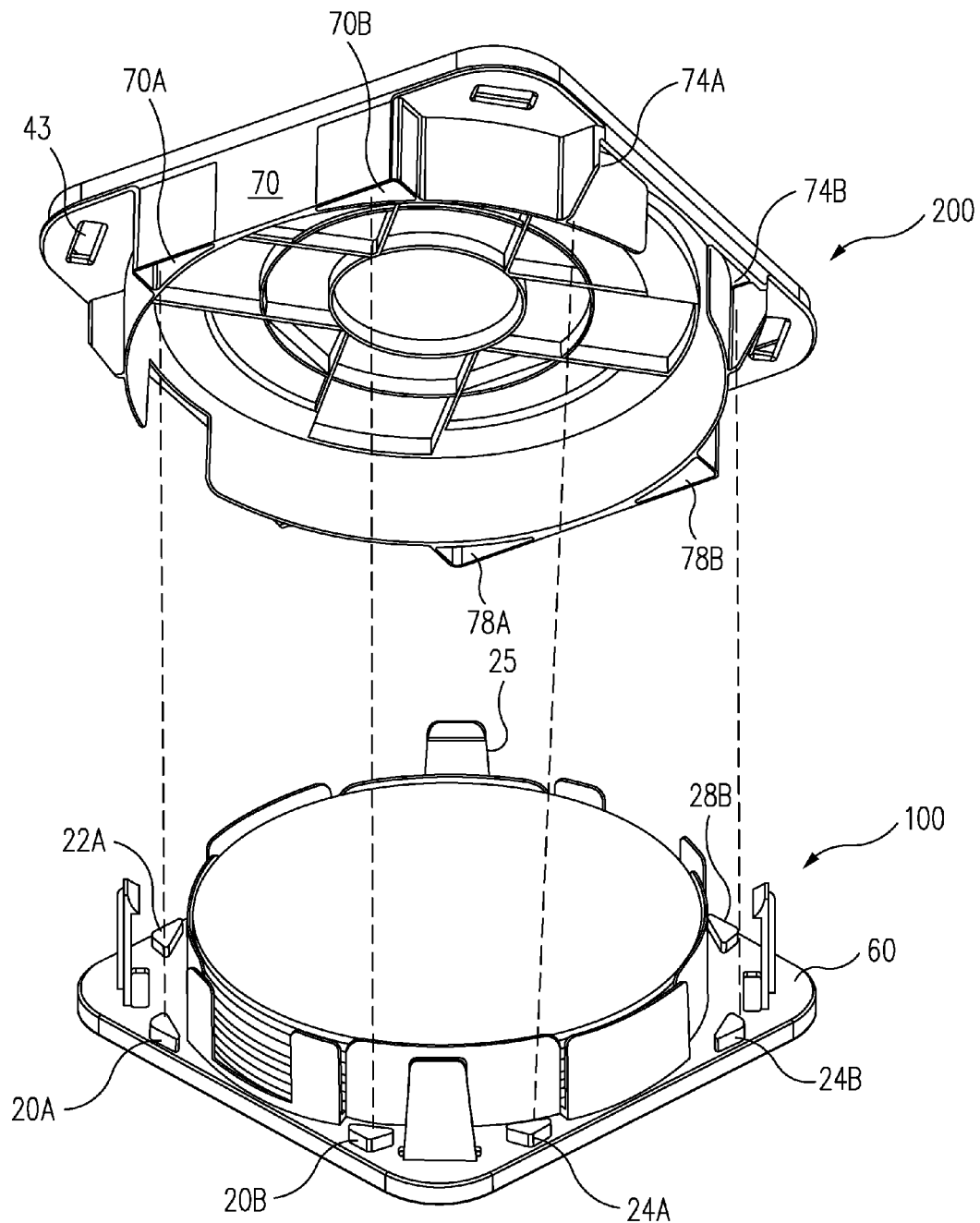
FIG. 2 illustrates reference tabs on the base in alignment with the cover.

FIG. 2 illustrates an alternative embodiment for the base 100 of wafer container 250. In this more preferred embodiment, a series of reference tabs are mounted on deck 60 of base 100. Reference tabs 20A, 20B, 22A, 22B, 24A, 24B, 28A, and 28B are designed to help align base 100 with cover 200 in the following manner. Cover 200 has support brackets that are designed to register with tabs 20, 22, 24, and 28. In particular, recess 70A of bracket 70 loosely fits over tab 20A, while recess 70B loosely fits over tab 20B. Similarly, recess 78A fits over tab 28A (not shown), while recess 78B slips over tab 28B. Recesses 74A and 74B fit over tabs 24A and 24B respectively. Preferably, none of the recesses of support brackets 70, 72, 74, 78 will snugly fit onto tabs 20, 22, 24, and 28. In the most preferred embodiment, each of the four support brackets will be identical and have the appearance of support bracket 70. FIG. 3C illustrates cover 200 where the all of the support brackets have an identical structure.

Figure 3A:
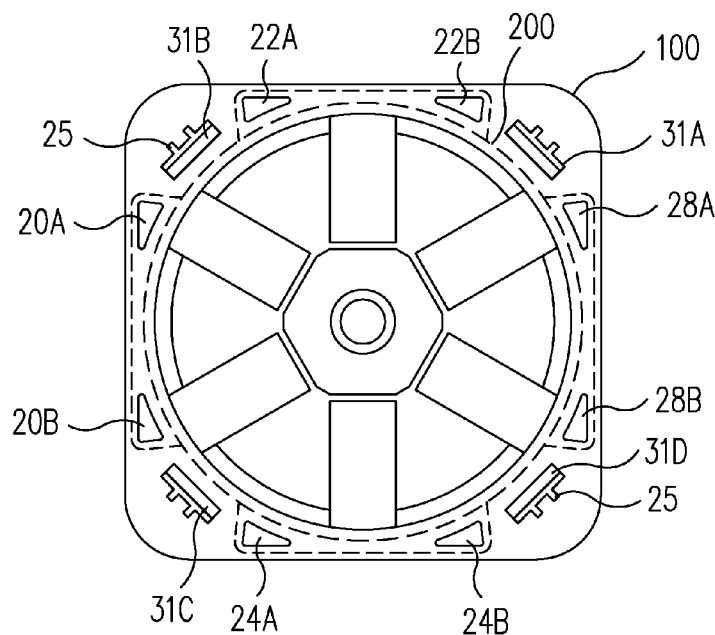
FIG. 3A illustrates reference tabs in alignment with a cover.
Figure 3B:
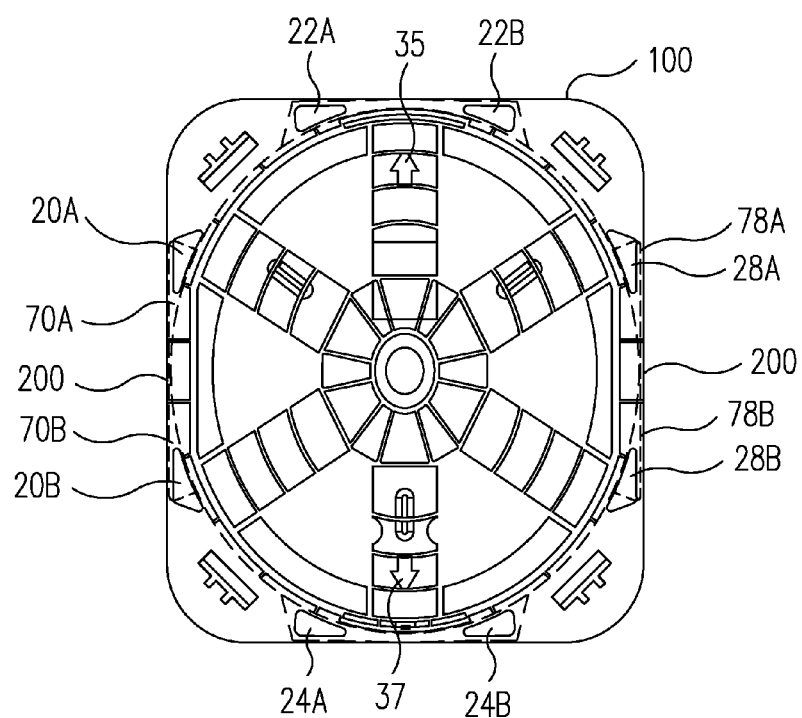
FIG. 3B illustrates reference tabs in misalignment with a cover.
Figure 3C:
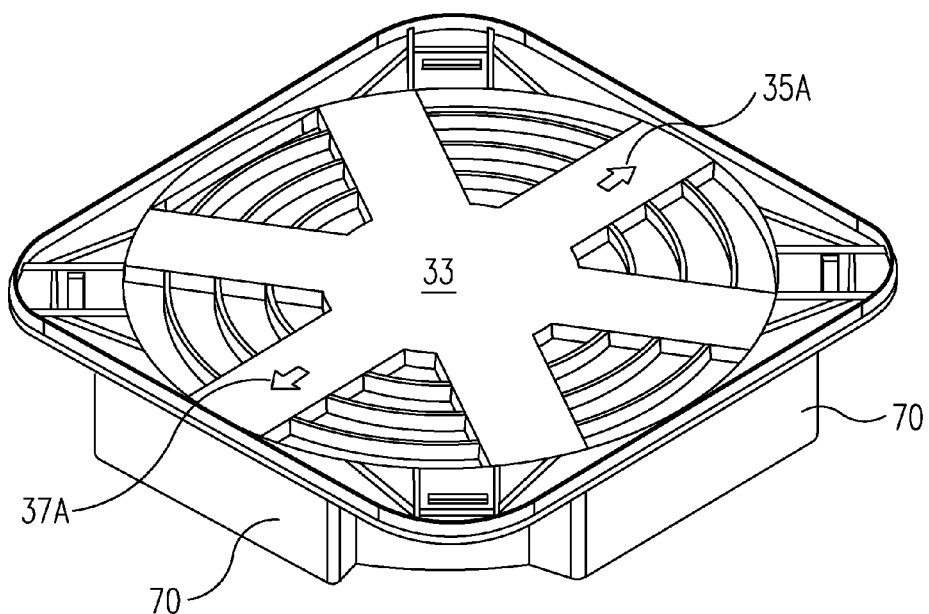
FIG. 3C illustrates a cover with alignment arrows to facilitate proper orientation to a base.

In FIG. 3A, a top view of base 100 is shown along with a skeletal view of cover 100. A hatched outline is used to indicate cover 200 and how cover 200 is properly aligned to base 100. A latch 25 on each corner is also shown in FIG. 3A. Adjacent to each latch is an opening 31 which provides latch 25 latitude for moving into a latched or unlatched position. Pairs of references tabs are located on each side of an upper surface of base 100. For example, in FIG. 3A, tabs 24A and 24B are located on one side of base 100 between openings 31C and 31D, while tabs 28A and 28B are located on an adjacent side of base 100 between openings 31A and 31D. Similarly, tabs 22A and 22B are located on a different side of base 100 between openings 31B and 31A. Tabs 20A and 20B are located on a fourth side of base 100. FIG. 3B illustrates cover 200 of FIG. 3A after it has been rotated 90°. In the position of FIG. 3B, cover 200 is misaligned with its base 100. Cover 200 can not properly fit onto base 100 because recess 70A and recess 78A do not register with reference tab 20A and reference tab 28A respectively. That is, the recesses of support brackets 70 and 78 do not slide freely onto tabs 20A and 28A, thereby preventing cover 200 from being improperly positioned onto base 100. FIG. 3B also illustrates orientations arrows 35 and 37. Orientation arrows 35, 37 provide a visual reference to assist an operator in properly aligning cover 200 with base 100. In a preferred embodiment, cover 200 will also have a pair of orientation arrows as shown in FIG. 3C that coincide with the arrows on base 100 when the two halves are in proper place relative to each other. Instead of an arrow, any other type of visual mark may be used to assist an operator in identifying when the cover and the base are properly aligned.

Figure 4A:
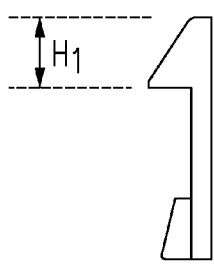
FIG. 4A illustrates the height dimension of the hook portion of the latch.
Figure 4B:
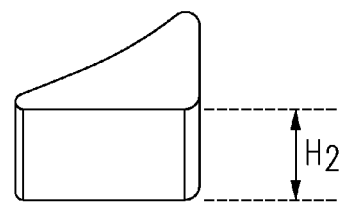
FIG. 4B illustrates the height dimension of the reference tabs of FIG. 2.

The height dimension H1 of the latch hook is shown in FIG. 4A. The height dimension H2 of reference tab is shown in FIG. 4B. H2 should have a height that will prevent latch 25 from engaging to cover 200 if cover 200 is not adequately pressed down onto base 100. In a preferred embodiment, H2>H1.

Figure 5:
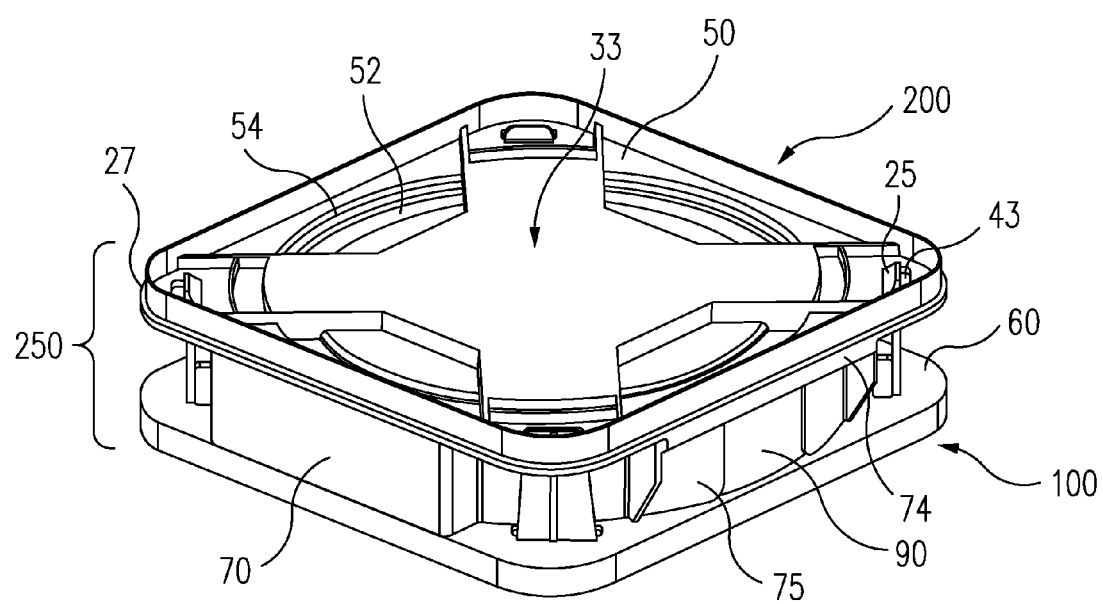
FIG. 5 illustrates the container of FIG. 1 with the top cover being secured to the bottom half.

FIG. 5 illustrates a perspective view of the closed wafer container 250. Specifically, sidewall 75 and support brackets 70 and 74 of cover 200 enclose the exterior of wall structure 80, 90, and 92 to form closed container 250. The major surface 50 of cover 200 has a pattern that provides structural strength as well as stiffness to the top portion of container 250. In particular, it was found that adding a star shaped pattern 33 on cover 200 and concentric ribs 52, 54, resulted in a stiff and lightweight cover 200. The star-shaped pattern 33 is not limited to four arms, but it can have more than four arms as shown in FIG. 3B. Base 100 also has a latch 25 mounted on each corner of a deck 60. The two halves of container 250 are secured when each latch 25 locks onto a respective notch 43 of cover 200 as shown in FIG. 5. Also visible in FIG. 5 is a lip 27 on the periphery of cover 200. This lip 27 enables the container 250 to be stacked on a second container identical to the first one.

Figure 6A:
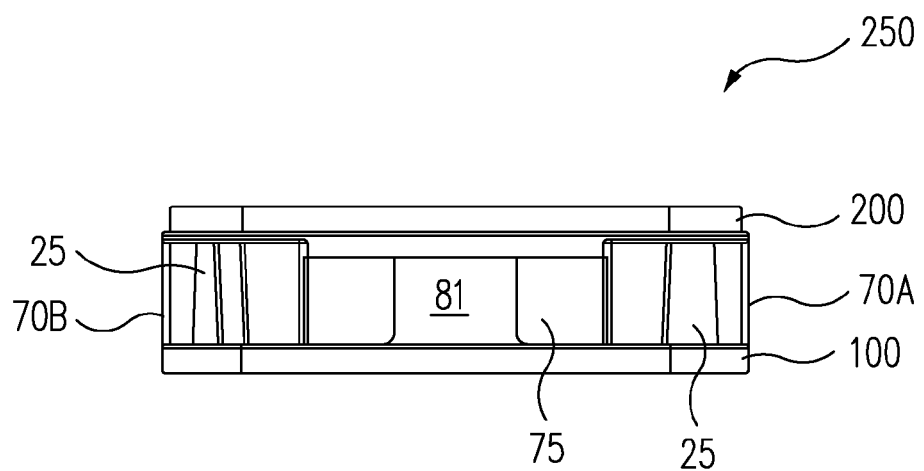
FIG. 6A is a side view of the closed container of FIG. 5.
Figure 6B:
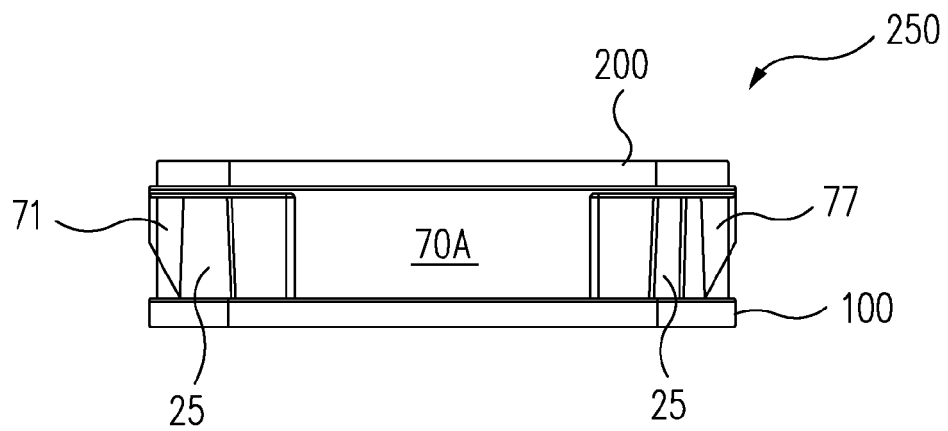
FIG. 6B is an alternate side view of the closed container of FIG. 5.

To illustrate how the segmented wall structure of base 100 mates with its cover 200, a side view of container 250 is shown in FIGS. 6A and 6B. Wall segment 90A fits inside sidewall 75 of cover 200. Sidewall 75 has slots 15, which allow a portion of outer walls 90A and 90B, shown in FIG. 8 to be exposed. Similarly, outer wall 90B will fit inside sidewall 75 of cover 100 when the two halves 100, 200 are engaged. In addition, support brackets 70A and 70B nest outside outer walls 92A and 92B of base 100, providing a stable storage area for the wafers stored inside.

Figure 7:
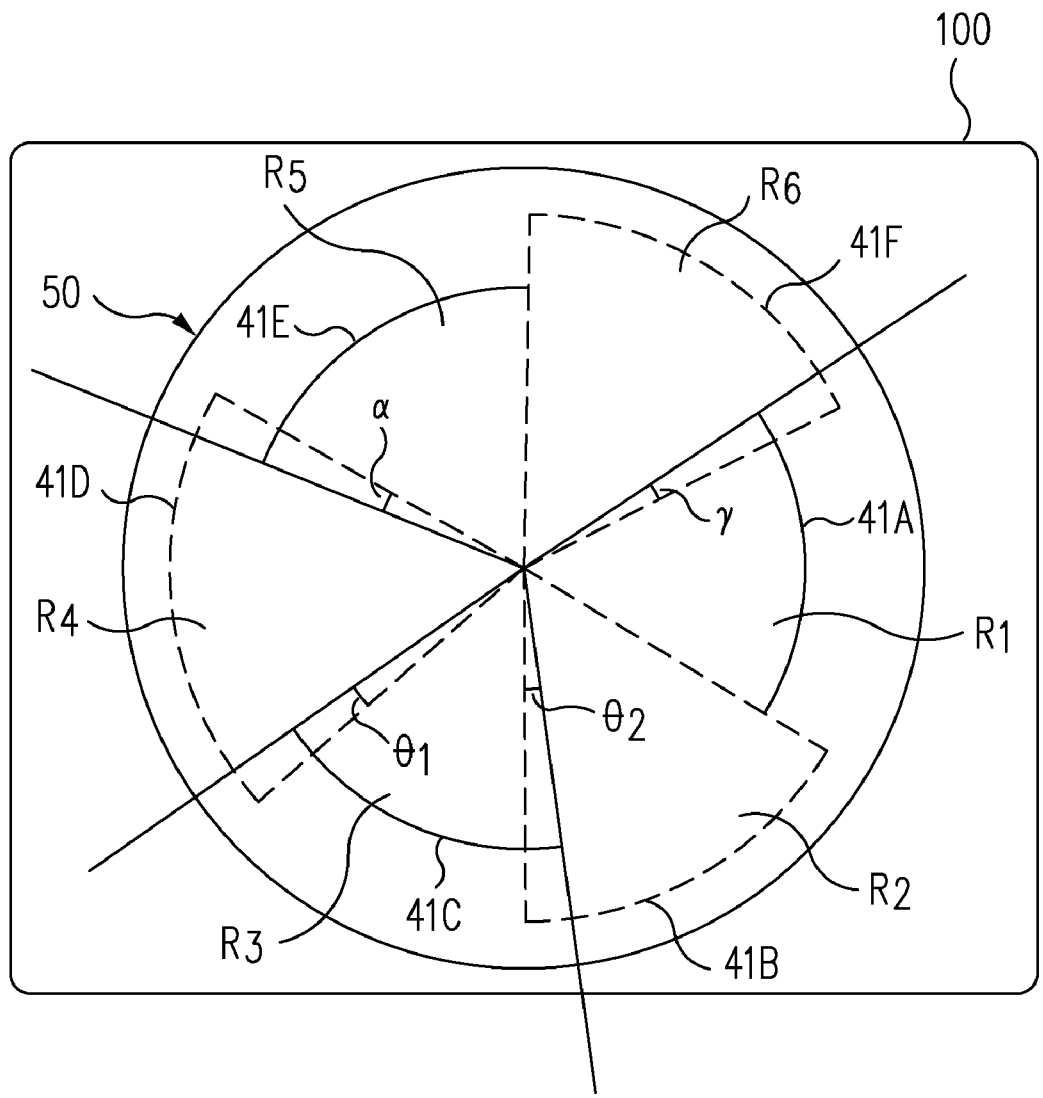
FIG. 7 illustrates the location of angular sectors on the base of the present invention.

The various wall segments on base 100 occupy specific areas within a circumference on base 100. These areas are referred to herein as angular sectors. FIG. 7 illustrates one example of the angular sectors R1-R6 that may exist within a circumference 50 located on base 100. R1, R3, and R5 represent angular sectors where an inner wall segment is to be located, while R2, R4, and R6 represent areas where an outer wall segment is to be located. The outermost boundary of each angular sector is defined by an arc. Outermost arcs are indicated as 41B, 41D and 41F. The innermost arcs within circumference 50 are 41A, 41C, and 41E. Arc 41A is shown as extending into angular sector 41F by an angle $\gamma$ of approximately 2°. Arc 41C is shown as extending into both adjoining sectors R4 and R2 by an angle $\theta_1$ and $\theta_2$, wherein $\theta_1$ is approximately 3° and $\theta_2$ is approximately 4°. Arc 41E extends from sector R5 by an angle $\alpha$, which is approximately 5°. Although only six angular sectors are shown, the container can have eight or more angular sectors.

Figure 8:
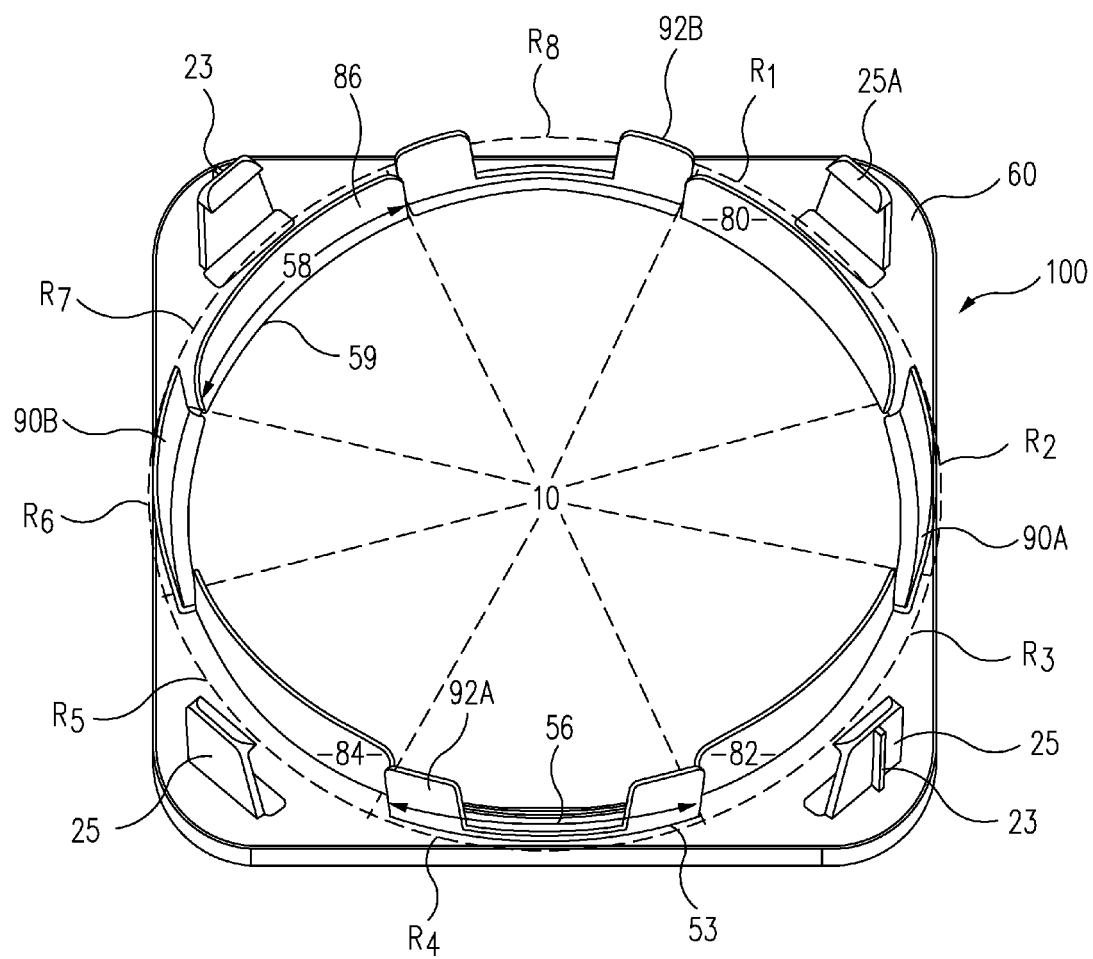
FIG. 8 is a top view of the base.

FIG. 8 is a top view of base 100, showing both the segmented walls 80, 82, 84, 86, 90A, 90B, 92A, 92B and angular sectors R1-R8. The floor 10 of deck 60 is shown without any ribbed pattern 30 to illustrate a more clarified view of angular sectors R1-R8. However, it is understood that the ribbed pattern 30 is present in a preferred embodiment. Perpendicular, or nearly perpendicular, to base 100 are a series of inner walls, 80, 82, 84 and 86. In addition, a series of outer walls 90A, 90B, 92A, 92B are also perpendicular, or nearly perpendicular, to base 100. Each of the walls shown has an arc with a specific arc length. For example, inner wall 86 has an arc 59 with an arc length 58. Similarly, outer wall 92A has an arc 53 with an arc length 56. Each inner and outer wall occupies one of angular sectors R1-R8. Between 50 and 99.5% of the inner wall arc is not located in the same angular sector as the arc of an adjacent outer wall. For example, over 90% of the inner wall arc 59 is located in R7, and occupies virtually none of the adjoining angular sectors R6 or R8. Outer wall 92A is located on arc 53, and is located almost entirely within angular sector R4. Consequently, approximately 95% of outer wall 92A is not located in adjoining angular sector R3 or R5.

Since inner wall segments alternate with outer wall segments, the arc of an inner wall may encroach into an adjoining angular sector. In a preferred embodiment of the invention, the arc length of each inner wall segment encroaches approximately 0 to 50% of the arc length of an adjoining angular sector of an outer wall. In a more preferred embodiment of the invention, inner wall 82 occupies angular sector R3 and shares between 0.1% to 25% of angular sector R4 with outer wall 92A; inner wall 82 also shares between 0.1% to 25% of angular sector R2 with outer wall 90A. Most preferably, inner wall 82 shares between 0.1% to 10% of angular sector R4 with outer wall 92A and between 0.1% to 10% of angular sector R2 with outer wall 90A. Similarly, inner wall 80, which principally occupies angular sector R1, preferably shares between 0 to 50% of angular sector R2 with outer wall 90A and between 0-50% of angular sector R8 with outer wall 92B. More preferably, inner wall 80 shares between 0.1% to 25% of angular sector R2 with outer wall 90A; inner wall 80 also shares between 0.1% to 25% of angular sector R8 with outer wall 92B. Most preferably, inner wall 80 shares between 0.1% to 10% of angular sector R2 with outer wall 90A and between 0.1% to 10% of angular sector R8 with outer wall 92B.

The invention is not limited to a container that has only the eight angular sectors R1-R8 shown in FIG. 8. The invention will work with a base having fewer than eight angular sectors, as well as a base with more than eight angular sectors. The number of sectors will equal the total number of inner and outer wall segments. The arc of each wall segment defines an outermost boundary of each angular sector. Although each wall (80, 82, 84, 86, 90A, 90B, 92A, and 92B) in FIG. 8 separately occupies less than 90° of the base circumference (i.e., each wall preferably has an arc length less than ($\Pi/2$ radius)), it is not necessary that this always be the case for the invention to work. In other words, each wall can occupy a greater angular portion of the circumference. Moreover, each inner wall (80, 82, 84, 86) need not have the same arc length as every other inner wall. Similarly, it is not essential for each outer wall (90A, 90B, 92A, and 92B) to have the same arc length as every other outer wall on base 100. Also shown in FIG. 8 is a latch 25 mounted on each corner of base 100. On the rear of latch 25 is a rib 23. Rib 23 is an optional feature for strengthening latch 25. Although four latches are shown in FIG. 5, the invention will work satisfactorily if only two latches are present.

Figure 9:
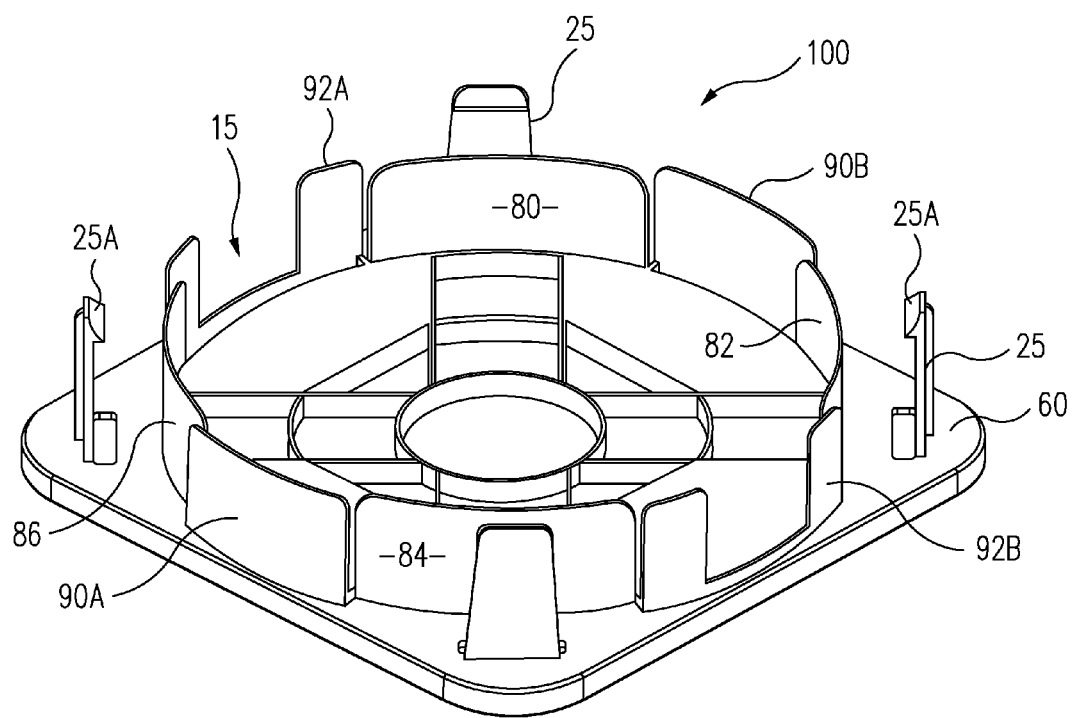
FIG. 9 is a perspective view of the base of the present invention.

FIG. 9 illustrates the bottom half of the wafer container 250, also referred to herein as base 100. The wall structure of base 100 includes segmented inner walls and segmented outer walls. A continuous wall structure is disadvantageously very stiff, even in the presence of one or two lateral openings. By providing a segmented wall structure, inner walls 80, 82, 84 and 86 are more flexible and shock absorbent. As a result, walls 80, 82, 84 and 86 sufficiently cushion wafers within container 250 if the container is dropped or otherwise subjected to forceful impact.

Outer walls 90A, 90B, 92A and 92B are staggered relative to inner walls 80, 82, 84 and 86 as shown in FIG. 9. This staggered double wall structure provides maximum protection from shock to wafers stored in container 250. In addition, outer walls 90A, 90B, 92A, and 92B have a greater flexible tolerance when their angular sector has minimum overlap with the angular sector of an adjacent inner wall. Outer walls 92A and 92B each have a slot 15. Preferably the lower portion of slot 15 does not extend to the same level as deck 60. Slot 15 enables an operator arm to more easily access wafers stored within base 100.

The deck 60 of FIG. 9 also includes latches 25 for securing base 100 to cover 200. Each latch 25 has a proximal end that is mounted on a corner region 60 of base 100. The distal end of each latch 25 terminates in a hook 25A that grasps onto cover 200.

Figure 10:
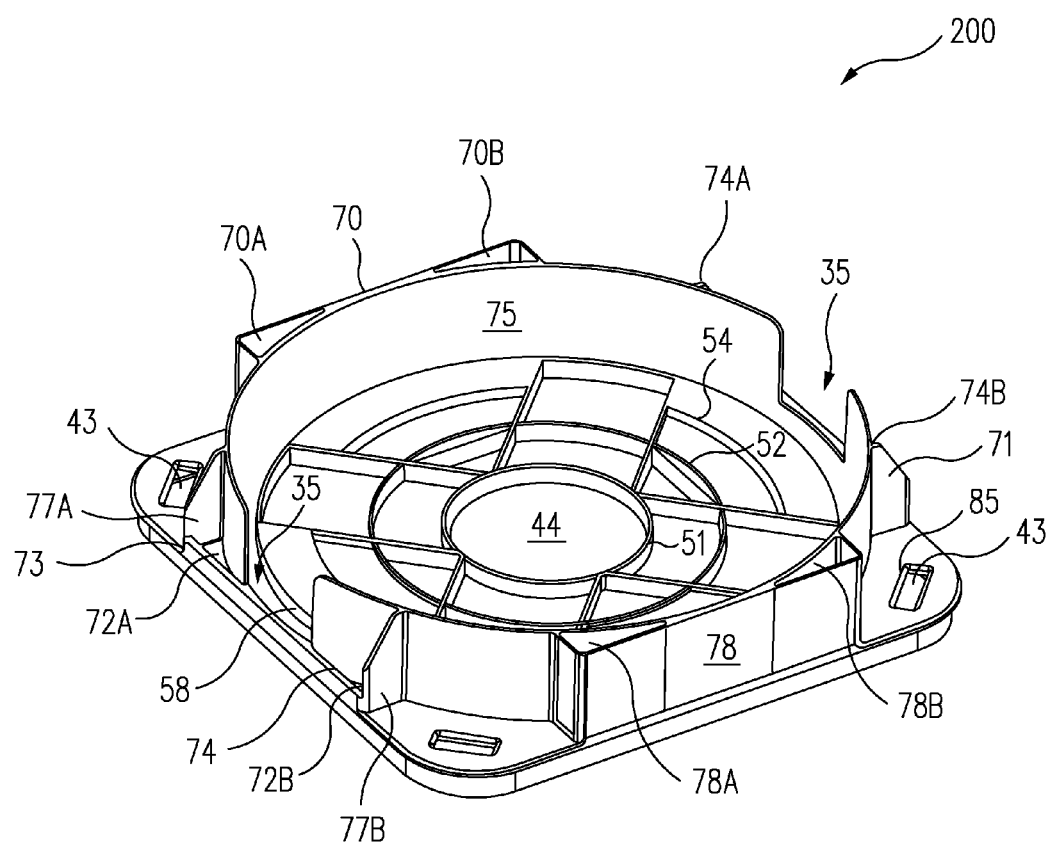
FIG. 10 is a perspective view of the interior of the top cover.

A detailed view of the cover 200 is shown in FIG. 10. On the interior surface 44 of cover 200 are a series of concentric ribs 51, 52, 54. Outermost rib 54 may contact a portion of the wall structure on base 100 if wafer container 250 is subjected to external forces. During shipping or handling, when closed container 250 encounters a forceful side impact, outer wall segments 90A, 90B, 92A and 92B absorb the bulk of the impact by flexing inward toward the inner diameter 12 of inner wall segments 80. The outer wall segments 90A, 90B, 92A and 92B are restrained from flexing beyond diameter 12 by rib 58 on the interior of cover 200.

In addition to ribs, cover 200 contains a sidewall 75 that extends perpendicularly from surface 44. In a preferred embodiment, two slots 35 are present in sidewall 75. Slots 35 are each surrounded by support bracket 71 or 73. Support brackets 70A and 70B are also attached to sidewall 75 on cover 200. Support brackets 70, 71 and 73 serve to orient cover 200 into a proper position on base 100. Bracket 73 has two fins 77A and 77B connected together by a narrow tie 74 so as to form recesses 72A and 72B. In addition, located within support bracket 71 are recesses 74A and 74B. The four corner regions 60 of cover 200 each have a notch 43 for receiving a respective latch 25. To enhance the security of cover 200 from becoming disengaged from base 100, notch 43 is provided with a ramp 85.

Figure 11:
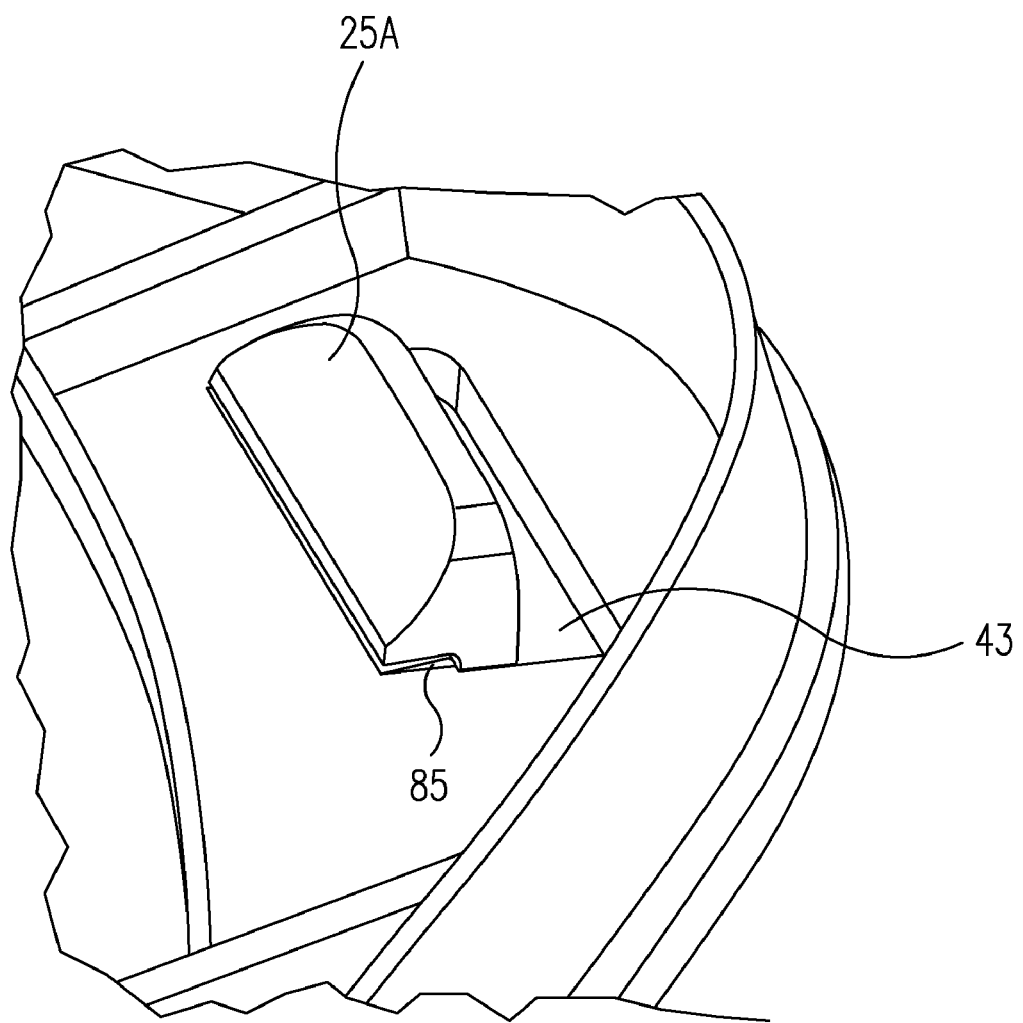
FIG. 11 is an exploded view of the ramp in FIG. 10.

FIG. 11 illustrates an exploded view of the locking mechanism of the invention that secures cover 200 to base 100. A notch 43 is shown having a rectangular shape. The longer edge of notch 43 has a ramp 85. Suitable angles for ramp 85 range from 5°-30° from the planar surface of cover 200. To secure cover 200 to base 100, notches 43 are aligned above their corresponding latches so that hook 25A can enter notch 43. Latch hooks 25A then slip downward over the positive slope of a ramp 85, i.e. positive relative to the top surface 50 of cover 200. Once latch 25 locks into place, cover 200 is securely engaged to base 100. To disengage cover 200 from base 100, an operator pushes back on hook 25A until it clears notch 43, and then the cover 200 is lifted away from base 100. Although notch 43 is shown to be rectangular, it can also have other shapes, such as a "T" or an ellipsoidal shape.

The examples described herein of the various segmented walls are solely representative of the present invention. It is understood that various modifications and substitutions may be made to the foregoing examples and methods of operation of the wafer container without departing from either the spirit or scope of the invention. In some instances certain features of the invention will be employed without other features depending on the particular situation encountered by the ordinary person skilled in the art. It is therefore the intent that the scope of the invention is to be defined by the appended claims.

What is claimed is:

1. A wafer container comprising:
   a base having a major surface that includes a plurality of angular sectors;
   segmented inner walls formed of individual wall segments located on a respective first arc on the base and separated from an adjacent wall by a space in a radial direction along said major surface;
   segmented outer walls formed of individual wall segments located on a respective second arc on the base and separated from an adjacent wall by a space in a radial direction along said major surface, each of said outer walls being unconnected to the inner walls along the entire length of the inner walls, wherein between 0.1 and 25% of the arc length of said first arc is located in the same angular sectors as the arc length of said second arc;
   a slot in at least one of said outer walls that extends at least substantially along the entire height of said outer walls, and has a width dimension that is greater than the distance between an inner wall and an outer wall; and
   a cover that engages to the base to form a closed container.

2. The wafer container of claim 1, wherein said segmented inner walls alternate with said segmented outer walls.

3. The wafer container of claim 1, further comprising:
   a plurality of brackets on the cover, wherein each bracket includes a pair of recesses;
   a pair of reference tabs on opposite sides of an upper surface of the base;
   wherein the recesses of each bracket slip over a respective pair of reference tabs to form a closed wafer container.

4. The wafer container of claim 1, wherein said cover contains a notch having a ramp, said ramp having a positive slope relative to a top surface of said cover for receiving the base.

5. The container of claim 1, further comprising a pair of latches connected to the base, wherein the latches secure the base to the cover when each latch locks onto a respective ramp on the cover.

6. The wafer container of claim 1, further comprising a plurality of semiconductor wafers stored therein.

7. A wafer container comprising:
   a base having a circumference that includes a plurality of angular sectors;
   segmented inner walls formed of individual wall segments located on a respective first arc on the base and separated from an adjacent wall by a space in a radial direction along said circumference; and
   segmented outer walls formed of individual wall segments located on a respective second arc on the base and separated from an adjacent wall by a space in a radial direction along said circumference, each of said walls being unconnected to the other walls, wherein between 0.1 and 50% of the arc length of said first arc is located in the same angular sectors as the arc length of said second arc; wherein said segmented inner walls alternate with said segmented outer walls.

8. The wafer container of claim 7, wherein between 0.1 to 25% of the arc length of said first arc is located in the same angular sector as the arc length of said second arc.

9. The wafer container of claim 7, wherein a slot is provided in at least one of said outer walls, said slot defined by a lower portion that extends near the level of said base, and by a lateral portion that extends to the upper surface of said outer wall.

10. The wafer container of claim 7, further comprising:
a cover;
a plurality of brackets on the cover, wherein each bracket includes a pair of recesses; and
a pair of reference tabs on opposite sides of an upper surface of the base;
wherein the recesses of each bracket slip over a respective pair of reference tabs to form a closed wafer container.

11. The wafer container of claim 7, wherein said a notch is located on a top surface of said cover, and wherein the notch includes a ramp that has a positive slope relative to the top surface of the cover.

12. The container of claim 11, further comprising a pair of latches connected to the base, wherein the latches secure the base to the cover when each latch locks onto a respective ramp on the cover.

13. The wafer container of claim 7, further comprising a plurality of semiconductor wafers stored therein.

* * * * *